(12) United States Patent
Tsuchiya et al.

(10) Patent No.: US 8,367,507 B1
(45) Date of Patent: Feb. 5, 2013

(54) MANUFACTURING METHOD OF SEMICONDUCTOR DEVICE

(75) Inventors: Yoshinori Tsuchiya, Kanagawa (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/404,779

(22) Filed: Feb. 24, 2012

(30) Foreign Application Priority Data

Sep. 8, 2011 (JP) ................................. 2011-195979

(51) Int. Cl.
*H01L 21/336* (2006.01)
(52) U.S. Cl. ................ 438/299; 257/E21.507
(58) Field of Classification Search .................. None
See application file for complete search history.

(56) References Cited

U.S. PATENT DOCUMENTS 6,686,255 B2 * 2/2004 Yang et al. ................ 438/439

OTHER PUBLICATIONS

Satoshi Tanimoto, et al., "Toward a better understanding of Ni-based ohmic contacts on SiC", Materials Science Forum vols. 679-680, 2011, pp. 465-468.

* cited by examiner

*Primary Examiner* — Seahvosh Nikmanesh
(74) *Attorney, Agent, or Firm* — Oblon, Spivak, McClelland, Maier & Neustadt, L.L.P.

(57) ABSTRACT

A method for manufacturing a semiconductor device according to the present embodiment includes the steps of forming a metallic silicide film on an n-type impurity region and a p-type impurity region made of silicon carbide (SiC), performing ion implantation of phosphorous (P) into the metallic silicide film on the n-type impurity region, performing a first thermal treatment, performing ion implantation of aluminum (Al) into the metallic silicide film on the p-type impurity region, and performing a second thermal treatment at a temperature lower than the first thermal treatment.

5 Claims, 15 Drawing Sheets

MANUFACTURING METHOD OF SEMICONDUCTOR DEVICE

CROSS-REFERENCE TO RELATED APPLICATION

This application is based upon and claims the benefit of priority from Japanese Patent Application No. 2011-195979, filed on Sep. 8, 2011, the entire contents of which are incorporated herein by reference.

FIELD

Embodiments described herein relate generally to a method for manufacturing a semiconductor device.

BACKGROUND

As a next generation power semiconductor device material, silicon carbide (which may be hereinafter also denoted as SiC) attracts attention. SiC has about 10 times the breakdown field strength and about three times thermal conductivity of silicon (which may be hereinafter also denoted as Si), and SiC can achieve a power semiconductor device capable of operating at a high temperature with a low loss, which cannot be achieved with a Si power device.

For example, a high-breakdown voltage power MOSFET has a low ON-resistance and high breakdown voltage, and can achieve fast switching operation. Accordingly, it is widely used as a switching device for a power circuit such as a switching power supply. The device structure of the high-breakdown voltage power MOSFET has a vertical-type MOSFET structure in which a source electrode, a gate electrode, and a well electrode are formed on a substrate surface, and a drain electrode is formed on a back surface of the substrate. Double Implantation MOSFET (which may be hereinafter also denoted as DIMOSFET) structure in which a channel formation region (well region) and a source region are respectively formed on a substrate surface using ion implantation is an advantageous device structure in which the channel region can be easily formed with high precision, and this is also suitable for parallel operation.

When a DIMOSFET using a SiC substrate is formed, an electrode for connecting this device to an electrical circuit and the like is desired to be in ohmic contact. However, a generally used hexagonal single-crystal SiC substrate has 4H-SiC structure of which laminating cycle is 4, and an energy band gap thereof is 3.26 eV, i.e., three times the energy band gap of Si. Therefore, it is difficult to form ohmic contact with an electrode metal.

When an n-type MOSFET is used, it is desired to achieve ohmic contact with source and drain $n^+$ regions as well as a $p^+$ region connected to a well region.

DETAILED DESCRIPTION

Figure 1:
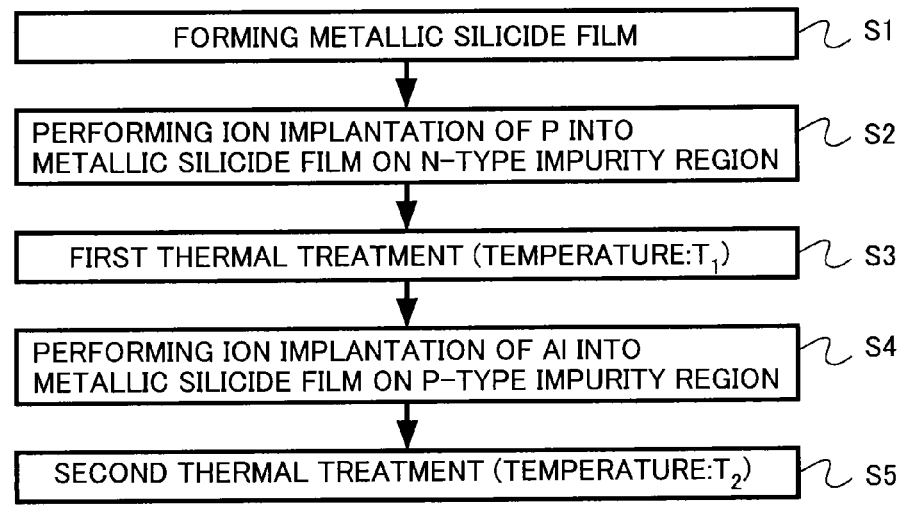
FIG. 1 is a flow diagram illustrating steps of a method for manufacturing a semiconductor device according to a first embodiment.

A method for manufacturing a semiconductor device according to an embodiment includes the steps of forming a metallic silicide film on an n-type impurity region and a p-type impurity region made of silicon carbide (SiC), performing ion implantation of phosphorous (P) into the metallic silicide film on the n-type impurity region, performing a first thermal treatment, performing ion implantation of aluminum (Al) into the metallic silicide film on the p-type impurity region, and performing a second thermal treatment at a temperature lower than the first thermal treatment.

As a method for achieving an ohmic contact of a relatively low resistance with SiC, a method for forming nickel silicide in an electrode portion is known. The nickel silicide layer is formed by depositing the nickel (Ni) on the SiC substrate surface of the contact region, and thereafter performing thermal treatment. However, there is a problem in that when the ohmic electrode is formed using the nickel silicide electrode, the required high-temperature thermal treatment degrades the device characteristics.

When the nickel silicide electrode is formed according to the above method, thermal treatment at 900° C. or higher is required in order to obtain preferable ohmic characteristics. This is because a thermal step at 900° C. or more is required in order to reduce the Schottky barrier height for electrons at the nickel silicide/SiC interface.

However, in the SiC-MOSFET, when ohmic electrodes are formed respectively for the source, the drain, and the well, and this kind of high-temperature thermal treatment is performed, the reliability of the gate insulating film is degraded, and the channel mobility is reduced. As a result, the device may not be able to operate normally. As described above, when the ohmic electrodes are formed without degrading the characteristics of the gate insulating film and the channel region, the maximum allowable thermal treatment temperature is 800° C. or less, and preferably, a process at 700° C. or less is required.

For example, a Schottky barrier diode, i.e., a rectifying device, is required to achieve preferable ohmic contact with low-temperature thermal history. More specifically, in a case of a Merged PiN and Schottky structure, a p-type ohmic electrode is formed on a p-type layer to pass a surge current, and an n-type ohmic electrode is formed on an n-type channel stop layer at a junction termination region end portion. An oxide film is formed on the SiC in the junction termination region. When the interface between the oxide film and the SiC is made rough due to the high-temperature annealing of the electrode, the extension of the depletion layer is affected, which may cause problems such as drop of the withstand voltage, increase of the leakage current, and reduction of the reliability. In order to prevent this, it is desired to form an ohmic electrode at such a thermal treatment temperature range in which the interface between the oxide film and the SiC is not made rough.

Hereinafter, embodiments of the present invention will be described with reference to the drawings.

First Embodiment

A method for manufacturing a semiconductor device according to the present embodiment includes the steps of forming a metallic silicide film on an n-type impurity region and a p-type impurity region made of silicon carbide (SiC), performing ion implantation of phosphorous (P) into the metallic silicide film on the n-type impurity region, performing a first thermal treatment, performing ion implantation of aluminum (Al) into the metallic silicide film on the p-type impurity region, and performing a second thermal treatment at a temperature lower than the first thermal treatment.

More specifically, the method for manufacturing the semiconductor device includes preparing a semiconductor substrate having a first n-type silicon carbide layer and a second n-type silicon carbide layer of which n-type impurity concentration is less than that of the first n-type silicon carbide layer, forming a first p-type impurity region in the second n-type silicon carbide layer, forming an n-type impurity region in the second n-type silicon carbide layer, forming a second p-type impurity region connected to the first p-type impurity region and having a depth shallower than that of the first p-type impurity region and having a p-type impurity concentration higher than that of the first p-type impurity region, forming a gate insulating film extending over surfaces of the second n-type silicon carbide layer, the first p-type impurity region, and the n-type impurity region, forming a gate electrode on the gate insulating film, forming a metallic silicide film on the n-type impurity region and the second p-type impurity region, performing ion implantation of phosphorous (P) into the metallic silicide film on the n-type impurity region, and performing a first thermal treatment, performing ion implantation of aluminum (Al) into the metallic silicide film on the second p-type impurity region, and performing a second thermal treatment at a temperature lower than the first thermal treatment.

Figure 2:
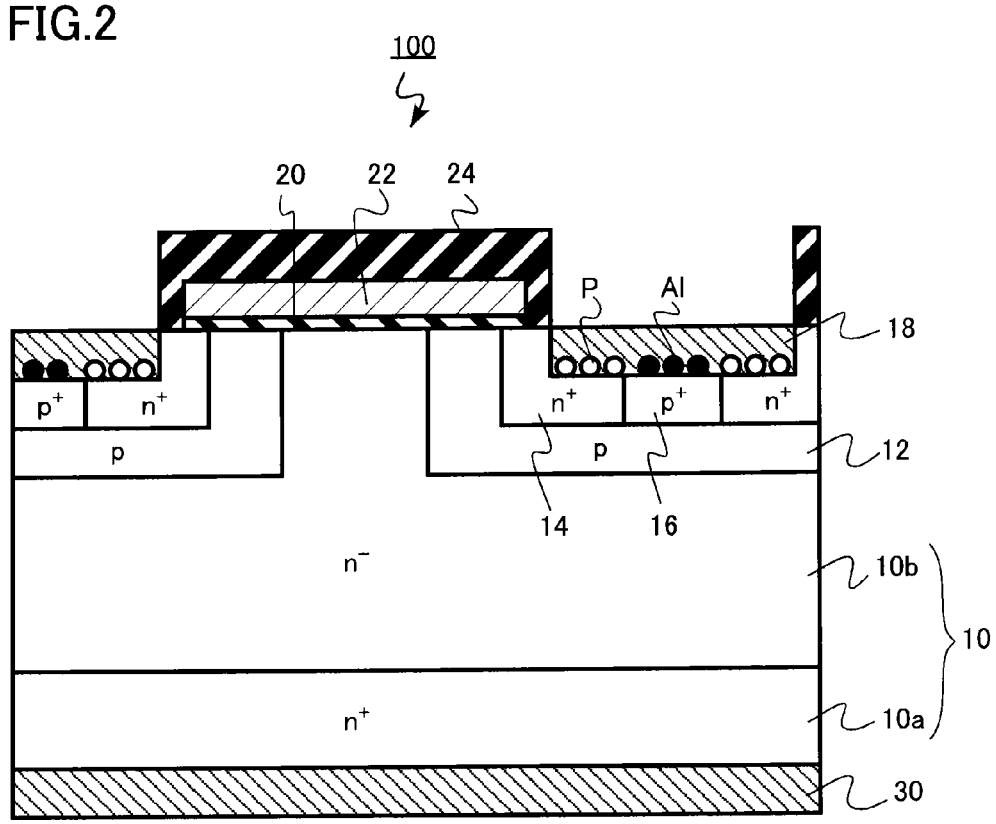
FIG. 2 is a cross sectional schematic diagram illustrating a DIMOSFET manufactured according to the manufacturing method of the first embodiment.

FIG. 2 is a cross sectional schematic diagram illustrating a DIMOSFET manufactured according to the manufacturing method of the present embodiment. As shown in FIG. 2, a DIMOSFET 100 includes a SiC substrate 10 of 4H-SiC including an n$^+$-type SiC layer (first n-type silicon carbide layer) 10a and an n$^-$-type SiC layer (second n-type silicon carbide layer) 10b having an n-type impurity concentration lower than that of the n$^+$-type SiC layer 10a.

For example, the n$^+$-type SiC layer 10a includes n-type impurity such as N (nitrogen) with an impurity concentration of about $5\times10^{18}$ to $1\times10^{19}$ cm$^{-3}$. The n$^+$-type SiC layer functions as a drain region of the DIMOSFET 100.

For example, the n$^-$-type SiC layer 10b is formed using an epitaxial growth method on the n$^+$-type SiC layer 10a. For example, the impurity concentration of the n-type impurity is about $5\times10^{15}$ to $2\times10^{16}$ cm$^{-3}$. The thickness of the n$^-$-type SiC layer 10b is, for example, about 5 to 20 µm.

In the n$^-$-type SiC layer 10b, a p-type SiC region (first p-type impurity region) 12 is formed. The p SiC region 12 functions as a well region or a channel region of the DIMOSFET 100. The impurity concentration of the p-type SiC region 12 is, for example, about $5\times10^{16}$ to $2\times10^{18}$ cm$^{-3}$.

In the n$^-$-type silicon carbide layer 10b, an n$^+$-type SiC region (n-type impurity region) 14 is formed to be enclosed by the p-type SiC region 12. The n$^+$-type SiC region 14 functions as a source region of the DIMOSFET 100.

The junction depth thereof is within a range of 0.05 µm to 10 µm, which is shallower than the junction depth of the p-type SiC region 12. The impurity of the n$^+$-type SiC region 14 is, for example, nitrogen (N) or phosphorous (P) or both of them, and for example, the impurity concentration is preferably about $1\times10^{19}$ to $3\times10^{21}$ cm$^{-3}$.

In the n$^-$-type SiC layer 10b, a p$^+$-type SiC region (second p-type impurity region) 16 is formed. The p$^+$-type SiC region (second p-type impurity region) 16 is enclosed by the p-type SiC region 12, is connected to the p-type SiC region 12, and is in contact with the n$^+$-type SiC region 14. The p$^+$-type SiC region 16 functions as a well connection region of the DIMOSFET 100.

The depth of the p$^+$-type SiC region 16 is shallower than the p-type SiC region 12. The impurity in the p$^+$-type SiC region 16 is boron (B) or aluminum (Al), or both of them. The impurity concentration is desirably about $1\times10^{19}$ to $3\times10^{21}$ cm$^{-3}$.

On the n$^+$-type SiC region 14 and the p$^+$-type SiC region 16, a nickel silicide region (nickel silicide film) 18 is formed. The nickel silicide region 18 functions as a source electrode and a well electrode of the DIMOSFET 100.

The film thickness of the nickel silicide region 18 is in a range of, for example, 0.001 µm to 0.2 µm, which is shallower than the depths of the n$^+$-type SiC region 14 and the p$^+$-type SiC region 16. From the viewpoint of reducing the sheet resistance of the source electrode, the film thickness of the nickel silicide region 18 is preferably thicker. This is because the specific resistance of the nickel silicide is one tenth or less than that of the n$^+$-type SiC region 14.

On the other hand, when the film thickness of the nickel silicide region 18 is increased, and the n$^+$-type SiC region 14 becomes thin, the junction leak current increases, which may degrade the device performance. In view of this point, the thickness (junction depth) of the n$^+$-type SiC region 14 is desirably ensured to be equal to or more than 10 nm, and more preferably it is 20 nm or more.

In view of heat resistance of the nickel silicide film, the nickel silicide region 18 is preferably equal to or more than 30 nm. When the film thickness is less than 30 nm, and thermal step of 600° C. or more is added to the silicide thermal step, the nickel silicide film is aggregated, so that the device performance may be degraded caused by the device yield degradation and increase of the sheet resistance value.

The phosphorous (P) of the n-type impurity is segregated at the interface between the nickel silicide region 18 and the n$^+$-type impurity region 14. Accordingly, the contact resistance between the nickel silicide region 18 and the n$^+$-type impurity region 14 is reduced, and ohmic characteristics are improved.

The aluminum (Al) of the p-type impurity is segregated at the interface between the nickel silicide region 18 and the p$^+$-type impurity region 16. Accordingly, the contact resistance between the nickel silicide region 18 and the p$^+$-type impurity region 16 is reduced, and ohmic characteristics are improved.

A gate insulating film 20 is continuously formed over the surfaces of the second n-type SiC layer 10b, the p-type SiC layer 12, and the n$^+$-type SiC region 14. The gate insulating film 20 may be, for example, a silicon oxide film, a high-k insulating film, and nitrides thereof.

On the gate insulating film 20, a gate electrode 22 is formed. The gate electrode 22 may be, for example, polycrystal silicon and the like. On the gate electrode 22, for example, a layer insulating film 24 made of a silicon oxide film is formed.

On the n$^+$-type SiC layer 10a, i.e., the back surface side of the SiC substrate 10, for example, a drain electrode 30 of nickel silicide is formed.

Subsequently, a manufacturing method of the DIMOSFET 100 according to the present embodiment as shown in FIG. 2 will be explained. FIG. 1 is a flow diagram illustrating steps of a method for manufacturing a semiconductor device according to the present embodiment. FIGS. 3 to 7 are cross sectional schematic diagrams illustrating steps of the method for manufacturing the semiconductor device according to the present embodiment.

First, the SiC substrate (semiconductor substrate) is prepared. The SiC substrate (semiconductor substrate) includes the 4H-SiC n$^+$-type SiC layer (first n-type silicon carbide layer) 10a and the 4H-SiC n$^-$-type SiC layer (second n-type silicon carbide layer) 10b of which n-type impurity concentration is less than that of the n$^+$-type SiC region 10a.

Subsequently, in the n$^-$-type SiC layer 10b, the p-type impurity region (first p-type impurity region) 12 is formed by, for example, thermal treatment (annealing) with Al ion implantation and activation. In addition, in the n$^-$-type SiC layer 10b, the n$^+$-type SiC region (n-type impurity region) 14 is formed by, for example, thermal treatment (annealing) with P ion implantation and activation.

Subsequently, in the n$^-$-type SiC layer 10b, the p$^+$-type SiC region (second p-type impurity region) 16 is formed. The p$^+$-type SiC region (second p-type impurity region) 16 is connected to the p-type SiC region 12, has a depth shallower than the p-type SiC region 12, and has a higher p-type impurity concentration than the p-type SiC region 12. The p$^+$-type SiC region 16 is formed by, for example, thermal treatment (annealing) with Al ion implantation and activation.

Subsequently, using a known method, the gate insulating film 20 is formed to extend over the surfaces of the n$^-$-type SiC layer 10b, the p-type SiC region 12, and the n$^+$-type SiC region 14. Further, on the gate insulating film 20, a gate electrode 22 and a layer insulating film 24 are formed.

Figure 3:
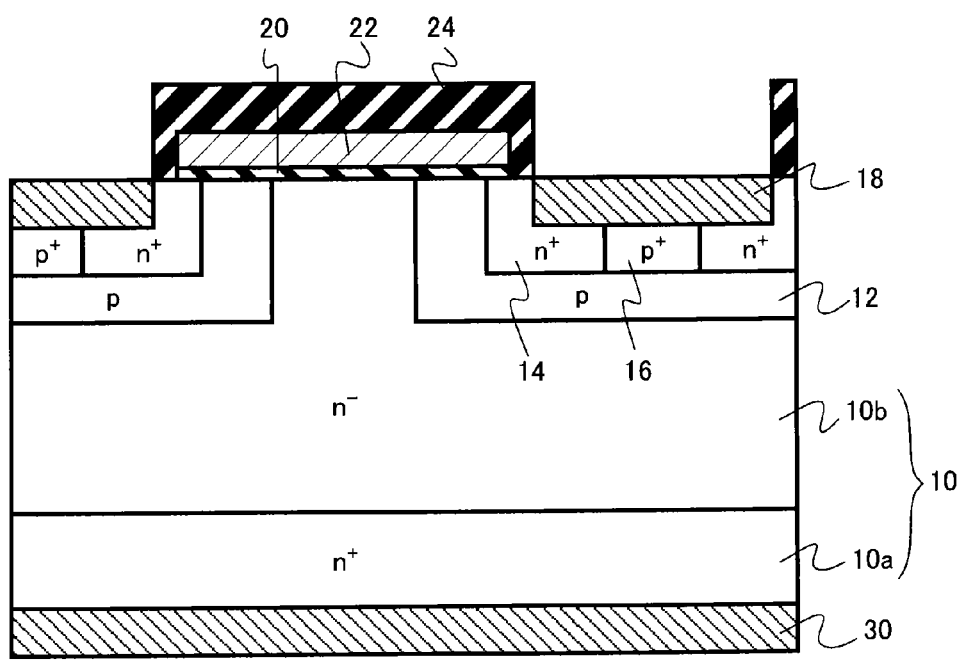
FIG. 3 is a cross sectional schematic diagram illustrating a step of the method for manufacturing the semiconductor device according to the first embodiment.
Figure 4:
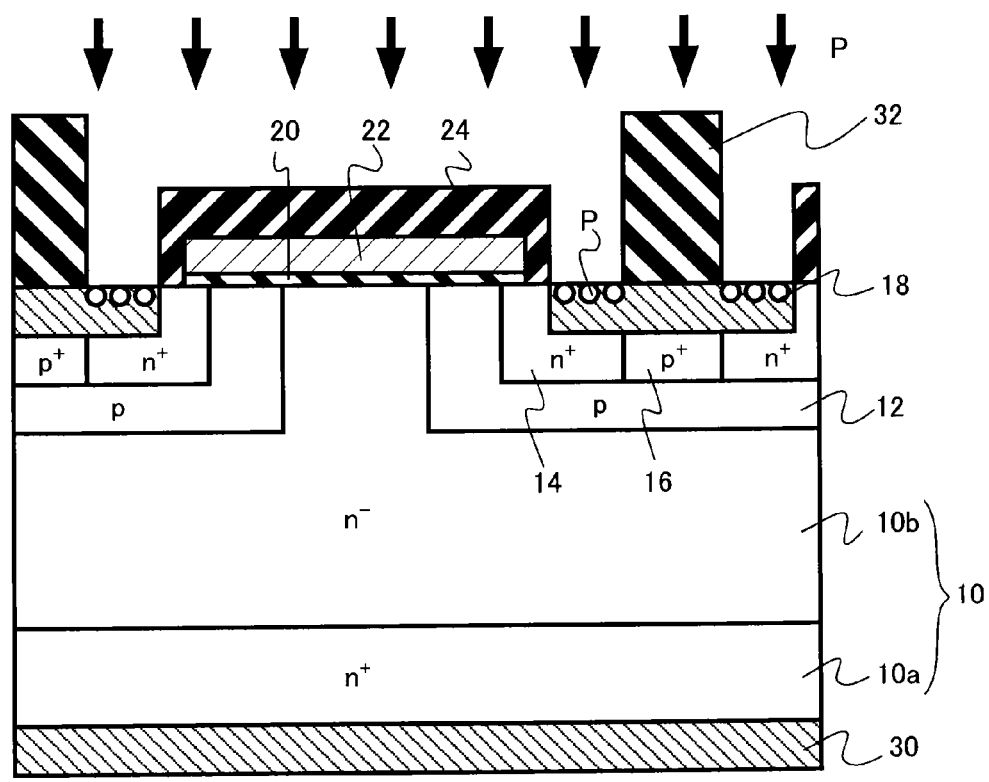
FIG. 4 is a cross sectional schematic diagram illustrating a step of the method for manufacturing the semiconductor device according to the first embodiment.
Figure 5:
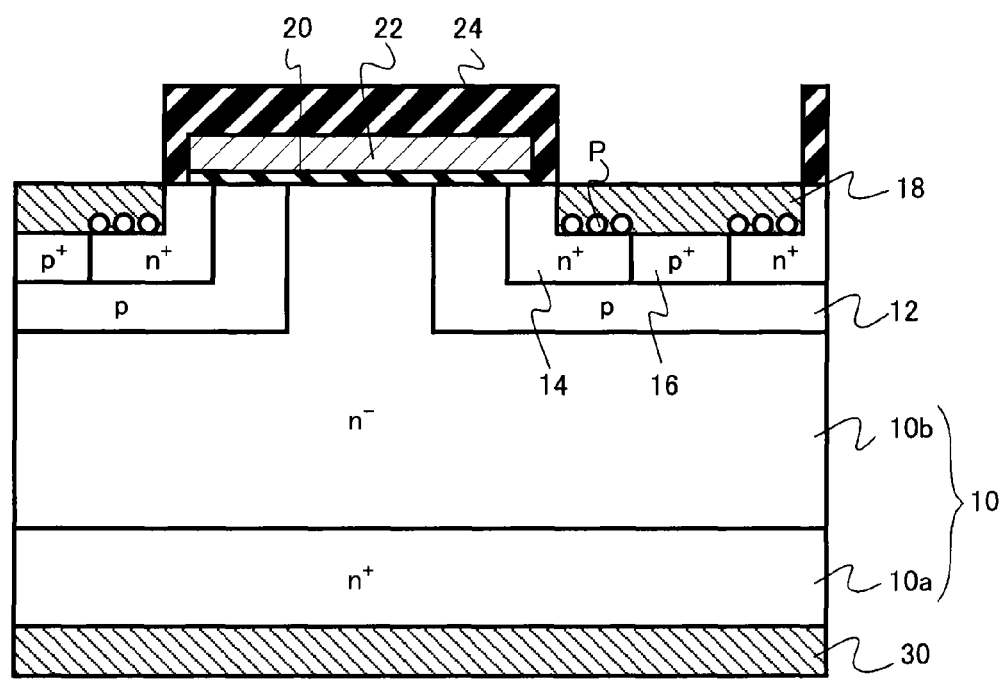
FIG. 5 is a cross sectional schematic diagram illustrating a step of the method for manufacturing the semiconductor device according to the first embodiment.
Figure 6:
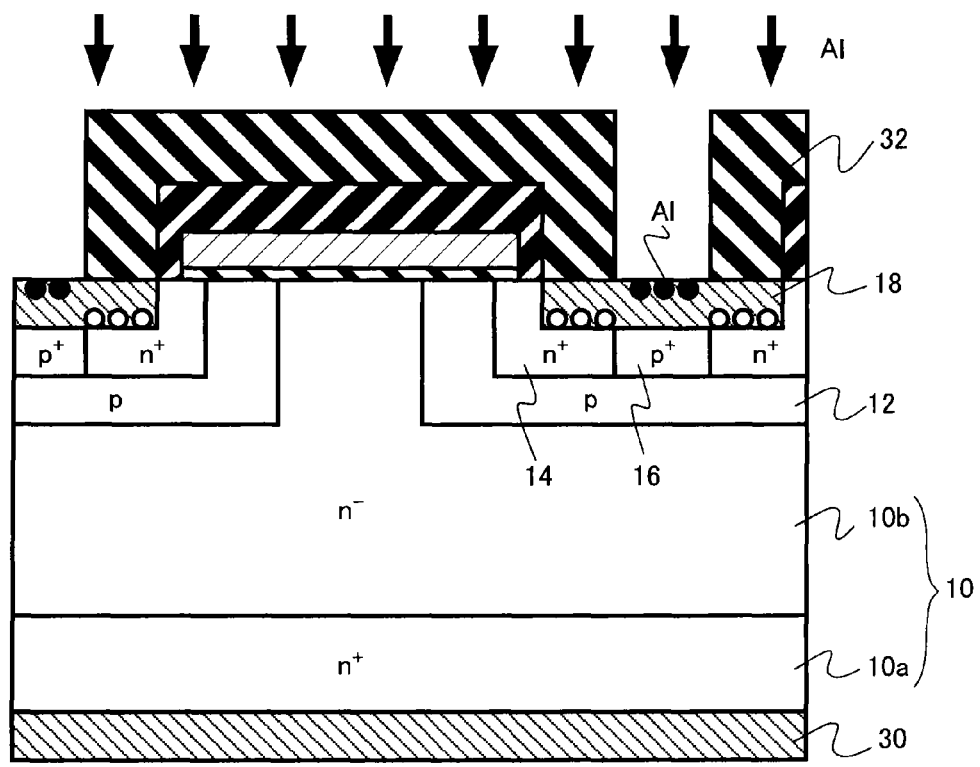
FIG. 6 is a cross sectional schematic diagram illustrating a step of the method for manufacturing the semiconductor device according to the first embodiment.
Figure 7:
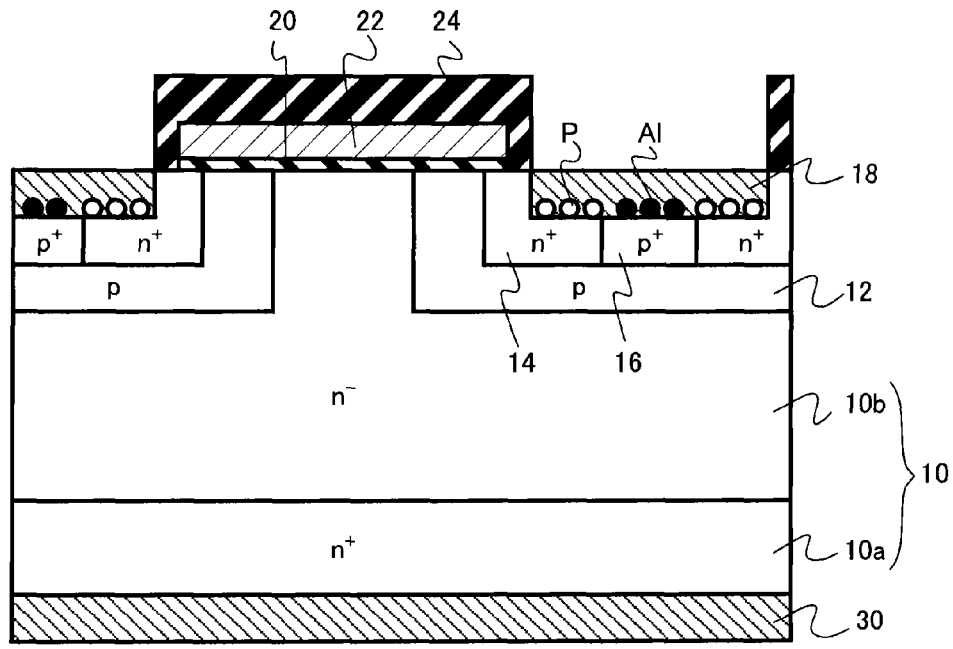
FIG. 7 is a cross sectional schematic diagram illustrating a step of the method for manufacturing the semiconductor device according to the first embodiment.

Subsequently, the nickel silicide region (nickel silicide film) 18 is formed on the n$^+$-type SiC region (n-type impurity region) 14 and the p$^+$-type SiC region (second p-type impurity region) (S1, FIG. 3). For example, the nickel silicide region 18 is formed according to the following method.

First, the preprocessing is performed with the diluted hydrofluoric acid. Thereafter, on the n$^+$-type SiC region (n-type impurity region) 14 and the p$^+$-type SiC region (second p-type impurity region) 16, a nickel film is deposited as a metallic film by sputtering method. Then, for example, annealing is performed at 600° C. so as to have the silicon carbide of the n$^+$-type SiC region 14 and the p$^+$-type SiC region 16 react with the nickel film, whereby the nickel silicide film is formed. Thereafter, the unreacted nickel film is removed with, for example, a mixed solution of sulfuric acid and hydrogen peroxide, and the nickel silicide region 18 is formed.

Subsequently, on the n$^+$-type SiC layer 10a, i.e., on the back surface side of the SiC substrate 10, the drain electrode 30 of nickel silicide is formed according to the same method.

Subsequently, mask patterning process is performed using a photoresist 32 so that the nickel silicide region 18 covers, with its bottom surface, a region in contact with the p$^+$-type SiC region 16. Then, via this resist pattern, the phosphorous (P) is ion-implanted into the nickel silicide region (nickel silicide film) 18 (S2, FIG. 4). In other words, the phosphorous (P) is selectively ion-implanted into the nickel silicide film on the n$^+$-type SiC region 14.

Regarding the P ion implantation condition, the energy is desirably within a range such that the impurity is injected into the nickel silicide film. It is not desired to increase the P ion acceleration energy as the P is injected into the n$^+$-type SiC region 14. This is because, if the impurity is also added to the n$^+$-type SiC region 14, crystal defects are induced in the n$^+$-type SiC region 14 due to the damage of the ion implantation, and this may be a cause of degrading the junction characteristics.

In order to avoid degradation of the junction characteristics, a P concentration peak position in the thickness direction immediately after the ion implantation is desirably in a shallow region of a depth equal to or less than a depth corresponding to one half of the film thickness of the nickel silicide region 18.

The amount of implantation of the P ion implantation may be determined in view of P segregation concentration to the nickel silicide region/SiC interface. The amount of implantation of P is preferably within a range of 1e14 cm$^{-2}$ to 1e16 cm$^{-2}$.

In the P ion implantation step, an insulating film such as a silicon oxide film and a silicon nitride film is formed on the surface of the nickel silicide region 18, and may be used as a through film for the ion implantation, in order to reduce physical damage applied to the metallic silicide film during the ion implantation, control the implantation depth distribution, or suppress scattering of Ni onto the layer insulating film by the ion implantation. Using the above through film, the sheet resistance of the nickel silicide film, i.e., one of parasitic resistances of the MOSFET is reduced by suppressing crystal structure destruction in the nickel silicide film.

Subsequently, the photoresist 32 is removed using ashing equipment, a dedicated removing solution, or a sulfuric acid-containing solution, and thereafter, first thermal treatment (temperature: $T_1$) is performed as diffusion thermal treatment. With this thermal treatment, the P applied to the nickel silicide region 18 thermally diffuses in the depth direction of the substrate, and thereby a structure is made such that the P is segregated at the nickel silicide/SiC interface (S3, FIG. 5).

The first thermal treatment, i.e., P diffusion thermal treatment, is desirably performed at 500° C. to 800° C. When the temperature is less than 500° C., the diffusion coefficient of P is small, and the P is less likely to diffuse in the substrate direction. When the temperature is more than 800° C., the outward diffusion of the P mainly occurs in the substrate direction, and the added P cannot be effectively introduced to the nickel silicide/SiC interface. This may also trigger a problem of degradation of the characteristics of the gate insulating film formed on the same substrate before the electrode is formed. In order to efficiently introduce the P to the nickel silicide/SiC interface in a short time, the range of thermal treatment temperature is desirably 550° C. to 700° C. More preferably, it is 600° C. to 700° C.

The P added to the nickel silicide region mainly diffuses to the nickel silicide/SiC interface via a crystal grain boundary of the nickel silicide. This is because, the P diffusion coefficient in the crystal grain interface is ten times or more larger than that in the nickel silicide crystal grain.

Therefore, in order to promote segregation of the P, it is effective to increase the crystal grain interface by making the crystal grain size of the nickel silicide into a pillar form or reducing the crystal grain size of the nickel silicide. For example, before the nickel film is formed, ion implantation is performed with germanium (Ge), silicon (Si), or a rare gas element, thereby making the silicon carbide of the $n^+$-type SiC region 14 and the $p^+$-type SiC region 16 into amorphous state, so that the crystal grain interface of the nickel silicide region 18 later formed can be increased.

However, this increase of the crystal grain interface may increase the sheet resistance of the nickel silicide region 18. For this reason, the crystal grain size and the structure thereof are required to be controlled within such a range that does not affect the characteristics of the device to be manufactured.

In addition to the P, it is possible to add an element that reduces the contact resistance at the nickel silicide/$n^+$SiC interface by segregating at the nickel silicide/SiC interface and changing the electron state and the distribution at the interface. More specifically, in addition to the P, an element selected from the group consisting of nitrogen (N), arsenic (As), sulfur (S), fluorine (F), and antimony (Sb) may be applied.

Subsequently, mask patterning process is performed using a photoresist 32 so that the nickel silicide region 18 covers, with its bottom surface, a region in contact with the $n^+$-type SiC region 14. Then, via this resist pattern, the aluminum (Al) is ion-implanted into the nickel silicide region (nickel silicide film) 18 (S4, FIG. 6). In other words, aluminum (Al) is selectively ion-implanted into the nickel silicide film on the $p^+$-type SiC region 16.

Regarding the Al ion implantation condition, the energy is desirably within a range such that the impurity is injected into the nickel silicide film. It is not desired to increase the Al ion acceleration energy as the Al is injected into the $p^+$-type SiC region 16. This is because, if the impurity is also added to the $p^+$-type SiC region 16, crystal defects are induced in the $p^+$-type SiC region 16 due to the damage of the ion implantation, and this may be a cause of degrading the junction characteristics.

In order to avoid degradation of the junction characteristics, an Al concentration peak position in the thickness direction immediately after the ion implantation is desirably in a shallow region of a depth equal to or less than a depth corresponding to one half of the film thickness of the nickel silicide region 18.

The amount of implantation of the Al ion implantation may be determined in view of Al segregation concentration to the nickel silicide region/SiC interface. The amount of implantation of Al is preferably within a range of $1e14$ cm$^{-2}$ to $1e16$ cm$^{-2}$.

In the Al ion implantation step, an insulating film such as a silicon oxide film and a silicon nitride film is formed on the surface of the nickel silicide region 18, and may be used as a through film for the ion implantation, in order to reduce physical damage applied to the metallic silicide film during the ion implantation, control the implantation depth distribution, or suppress scattering of Ni onto the layer insulating film by the ion implantation. Using the above through film, the sheet resistance of the nickel silicide film, i.e., one of parasitic resistances of the MOSFET is reduced by suppressing crystal structure destruction in the nickel silicide film.

Subsequently, the photoresist 32 is removed using ashing equipment, a dedicated removing solution, or a sulfuric acid-containing solution, and thereafter, second thermal treatment (temperature: $T_2$) is performed as diffusion thermal treatment at a temperature lower than the first thermal treatment (temperature: $T_1$). With this thermal treatment, the Al element applied to the nickel silicide region 18 thermally diffuses in the depth direction of the substrate, and thereby a structure is made such that the Al is segregated at the nickel silicide/SiC interface (S5, FIG. 7).

The second thermal treatment, i.e., Al diffusion thermal treatment, is desirably performed at 300° C. to 700° C. When the temperature is less than 300° C., the diffusion coefficient of Al is small, and the Al is less likely to diffuse in the substrate direction. When the temperature is more than 700° C., the outward diffusion of the Al mainly occurs in the substrate direction, and the added Al cannot be effectively introduced to the nickel silicide/SiC interface. This may also trigger a problem of degradation of the characteristics of the gate insulating film formed on the same substrate before the electrode is formed. In order to efficiently introduce the Al to the nickel silicide/SiC interface in a short time, the range of thermal treatment temperature is desirably 350° C. to 650° C. More preferably, it is 500° C. to 600° C.

The Al added to the nickel silicide region mainly diffuses to the nickel silicide/SiC interface via a crystal grain boundary of the nickel silicide. This is because, the diffusion coefficient in the crystal grain interface is ten times or more larger than that in the nickel silicide crystal grain.

Therefore, like the above case of the P, in order to promote segregation of the Al, it is effective to increase the crystal grain interface by making the crystal grain size of the nickel silicide into a pillar form or reducing the crystal grain size of the nickel silicide. For example, before the nickel film is formed, ion implantation is performed with germanium (Ge), silicon (Si), or a rare gas element, thereby making the silicon carbide of the $n^+$-type SiC region 14 and the $p^+$-type SiC region 16 into amorphous state, so that the crystal grain interface of the nickel silicide region 18 later formed can be increased.

However, this increase of the crystal grain interface may increase the sheet resistance of the nickel silicide region 18. Therefore, the crystal grain size and the structure thereof are required to be controlled within such a range that does not affect the characteristics of the device to be manufactured.

In addition to the Al, it is possible to add an element that reduces the contact resistance at the nickel silicide/$p^+$SiC interface by segregating at the nickel silicide/SiC interface and changing the electron state and the distribution at the interface. More specifically, in addition to the Al, an element selected from the group consisting of boron (B), gallium (Ga), and indium (In) may be applied.

Figure 8A:
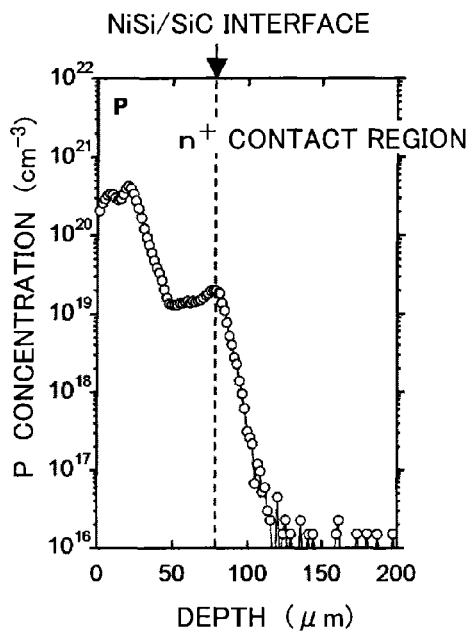
FIGS. 8A, 8B are impurity profiles of a DIMOSFET manufactured using the manufacturing method of the first embodiment.
Figure 8B:
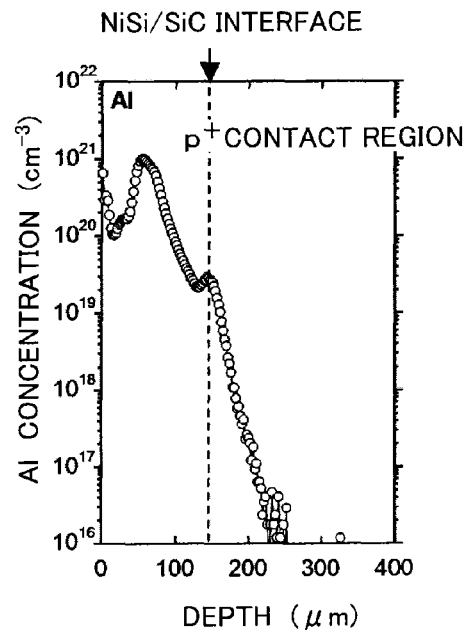

FIGS. 8A, 8B are impurity profiles of a DIMOSFET manufactured using the manufacturing method of the present embodiment. FIG. 8A is a profile of a nickel side/n$^+$SiC interface, i.e., P in the n$^+$ contact region. FIG. 8B is a profile of a nickel side/p$^+$SiC interface, i.e., Al in the p$^+$ contact region. This is obtained by analyzing the distributions of P and Al in the depth direction with SIMS (Secondary Ion Mass Spectroscopy).

It should be noted that the first thermal treatment temperature ($T_1$) is set at 650° C., and the second thermal treatment temperature ($T_2$) is set at 550° C.

According to the manufacturing method of the present embodiment, the P and Al segregation phenomenon occurs in the nickel silicide/SiC interface, and the P and Al of $1e10^{19}$ cm$^{-3}$ and more are detected. This SIMS analysis is performed from the surface side of the nickel silicide in the substrate direction, and the depth resolution of the nickel silicide/SiC interface is about 10 nm.

Actually, the nickel silicide/SiC interface is divided by a certain atomic plane, and the actual interface impurity segregation concentration is considered to have a value ten times larger. When atom probe method or high resolution TEM analysis technique is used, segregation of the impurity to the interface position in the atomic level and the segregation concentration are analyzed with high accuracy.

Figure 9:
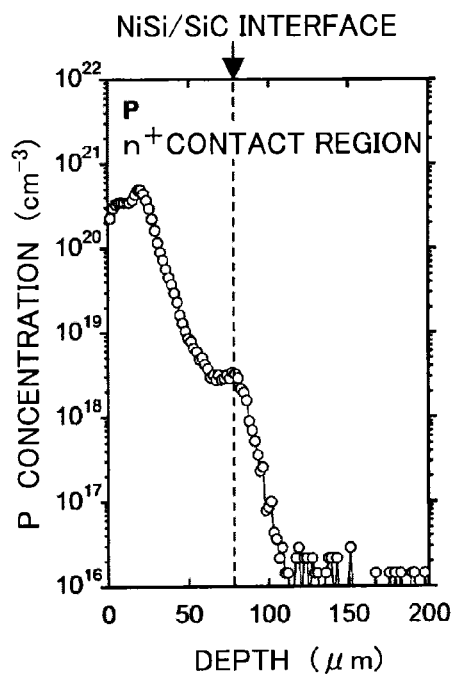
FIG. 9 is an impurity profile of P.

FIG. 9 is a depth direction distribution of the P when thermal treatment is performed at 550° C. for comparison. This is a case where, in the flow of the steps of FIG. 1, the first thermal treatment (temperature: $T_1$) is omitted, and only the second thermal treatment (temperature: $T_2$) is performed at 550° C. It is understood that the concentration of the P at the nickel silicide/SiC interface is equal to or less than 1e19 cm$^{-3}$, and the P is not segregated to the interface sufficiently.

Figure 10:
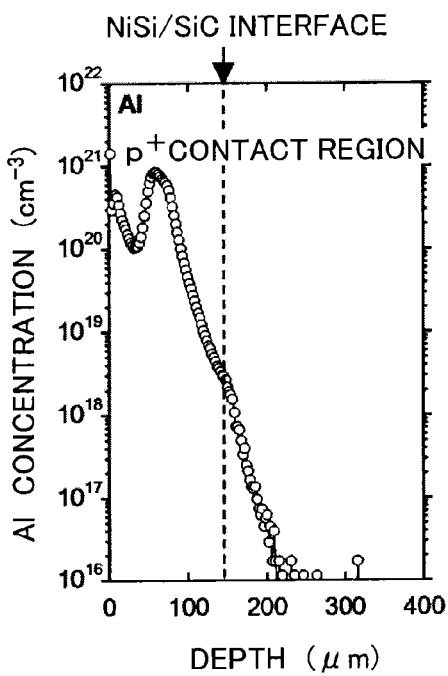
FIG. 10 is an impurity profile of Al.

FIG. 10 is a depth direction distribution of the Al when thermal treatment is performed at 650° C. for comparison. This is a case where, in the flow of the steps of FIG. 1, only the second thermal treatment (temperature: $T_2$) is performed at 650° C. Increase of concentration caused by segregation of Al at the nickel silicide/SiC interface is not observed. This is considered to be because Al diffused outwardly in the surface direction of the nickel silicide.

In other words, it is necessary to perform thermal treatment suitable for the P and Al in order to respectively segregate appropriate impurities to the both-conductivity-type nickel silicide/SiC interface as shown in FIG. 8, and the order of thermal treatments is as follows. First, the diffusion thermal treatment of the P (first thermal treatment) requiring the high temperature thermal treatment is performed, and thereafter, it is necessary to the low temperature diffusion thermal treatment (second thermal treatment) on the Al, i.e., the other one. In addition, it is necessary to first perform the high temperature diffusion thermal treatment of the P before the Al, i.e., the other one, is added.

Hereinabove, according to the method for manufacturing the semiconductor device according to the present embodiment, the contact resistance between the source electrode, i.e., the n$^+$-type contact electrode, and the well electrode, i.e., the p$^+$-type contact electrode, is reduced in the low temperature thermal step, and the ohmic property therebetween is improved. Therefore, the DIMOSFET having excellent characteristics can be manufactured.

Second Embodiment

A method for manufacturing a semiconductor device according to the present embodiment is the same as the first embodiment except that the metallic silicide film is also formed on the first n-type silicon carbide layer, and the phosphorous (P) is ion-implanted into the metallic silicide film on the first n-type silicon carbide layer. Accordingly, description about the same contents as those of the first embodiment is omitted.

Figure 11:
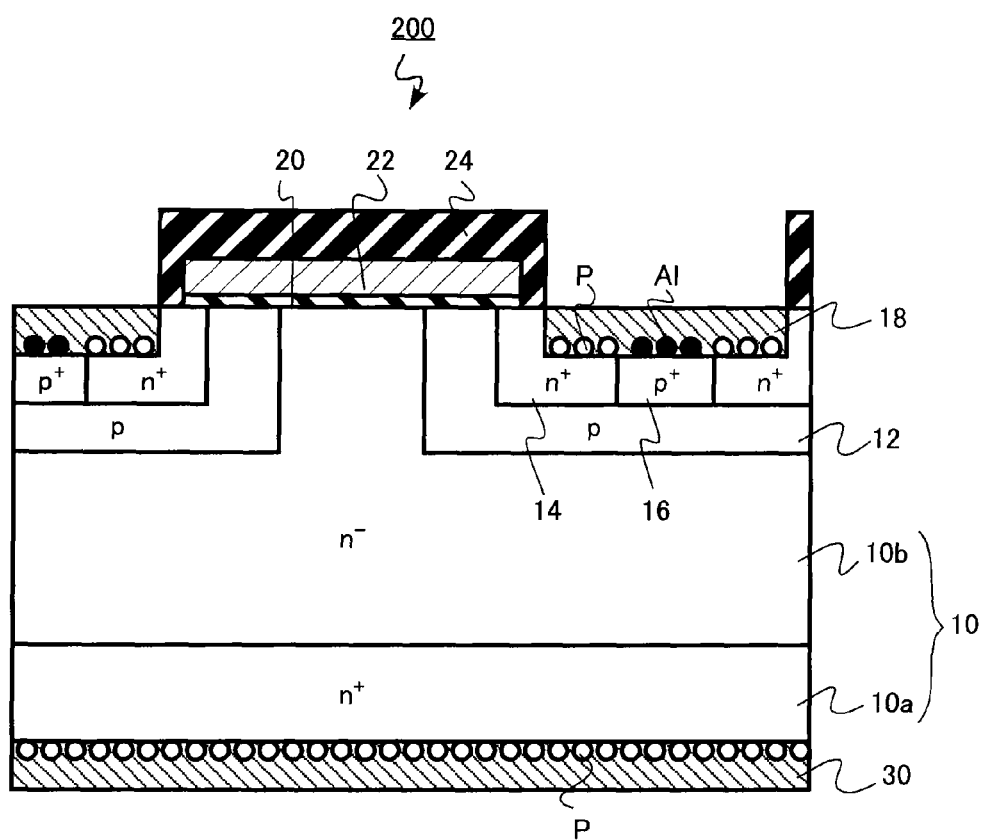
FIG. 11 is a cross sectional schematic diagram illustrating a DIMOSFET manufactured according to the manufacturing method of a second embodiment.

FIG. 11 is a cross sectional schematic diagram illustrating a DIMOSFET manufactured according to the manufacturing method of the present embodiment. In a DIMOSFET 200 according to the present embodiment, an n-type impurity, i.e., phosphorous (P), is segregated to the interface between the n$^+$-type SiC layer 10a and the nickel silicide film of the drain electrode 30 on the n$^+$-type SiC layer (first n-type silicon carbide layer) 10a on the back surface side of the semiconductor substrate 10. Accordingly, the contact resistance between the drain electrode 30 and the n$^+$-type SiC layer 10a is reduced.

Figure 12:
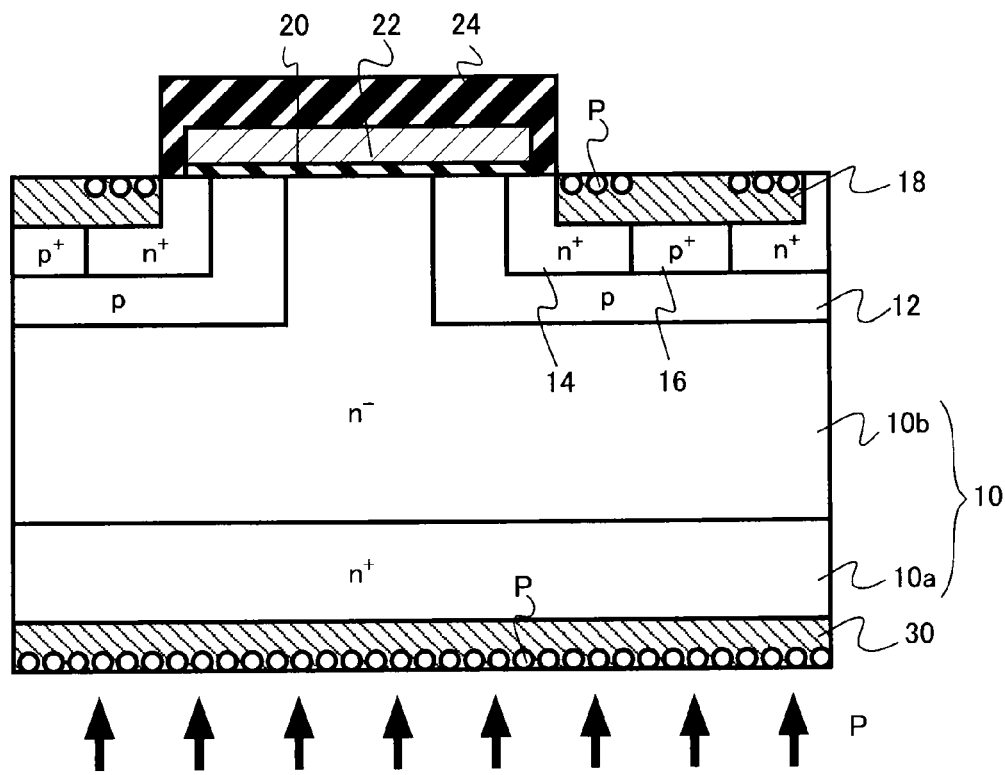
FIG. 12 is a cross sectional schematic diagram illustrating a step of the method for manufacturing the semiconductor device according to the second embodiment.
Figure 13:
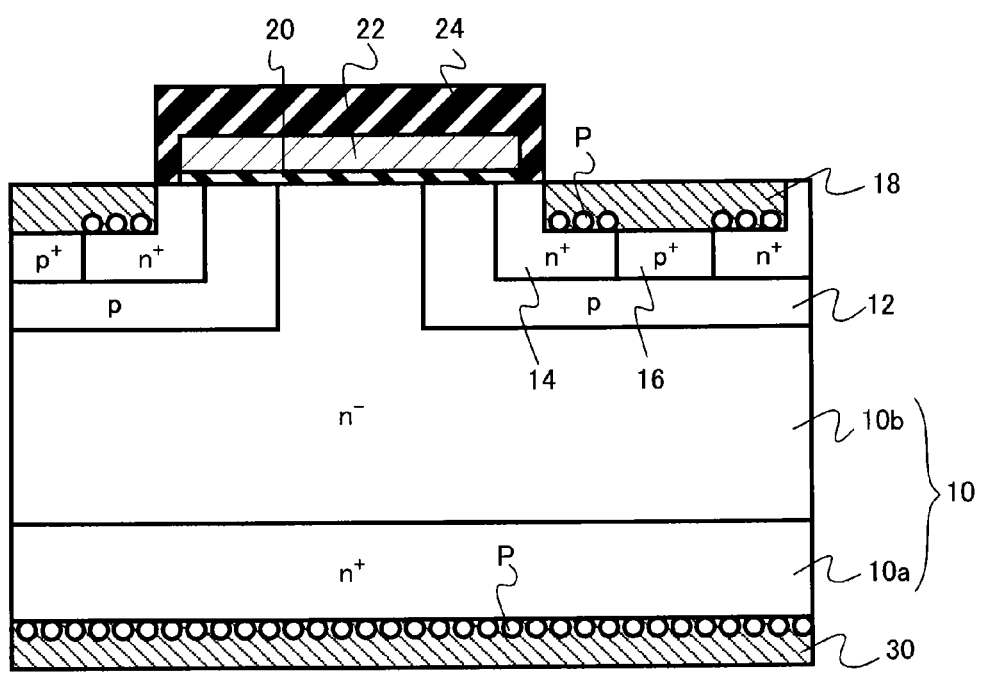
FIG. 13 is a cross sectional schematic diagram illustrating a step of the method for manufacturing the semiconductor device according to the second embodiment.

FIGS. 12 and 13 are cross sectional schematic diagrams illustrating steps of the method for manufacturing the semiconductor device according to the present embodiment. After the step of FIG. 4 as shown in the first embodiment, the P is ion-implanted into the nickel silicide film of the drain electrode 30 on the back surface (FIG. 12).

Subsequently, the first thermal treatment (temperature: $T_1$) is performed as the diffusion thermal treatment. With this thermal treatment, the P applied to the nickel silicide region 18 and the nickel silicide film of the drain electrode 30 thermally diffuses in the depth direction of the substrate, and thereby a structure is made such that the P is segregated at the nickel silicide/SiC interface (FIG. 13).

Preferred conditions of the P ion implantation, the first thermal treatment, and the like are the same as those of the first embodiment.

Thereafter, the DIMOSFET 200 of FIG. 11 is formed by performing the same steps as those of the manufacturing method of the first embodiment.

Hereinabove, according to the method for manufacturing the semiconductor device according to the present embodiment, the contact resistance between the source electrode and the drain electrode, i.e., the n$^+$-type contact electrodes, and the well electrode, i.e., the p$^+$-type contact electrode, is reduced in the low temperature thermal step, and the ohmic property therebetween is improved. Therefore, the DIMOSFET having more excellent characteristics can be manufactured.

Third Embodiment

A method for manufacturing a semiconductor device according to the present embodiment is different from the manufacturing method of the first and second embodiments in that it is not a manufacturing method of a DIMOSFET but is a manufacturing method of an IGBT (Insulated Gate Bipolar Transistor). Accordingly, description about the same contents as those of the first or second embodiment is omitted.

The method for manufacturing a semiconductor device according to the present embodiment includes preparing a semiconductor substrate having a p-type silicon carbide layer and an n-type silicon carbide layer, forming a first p-type impurity region in the n-type silicon carbide layer, forming an n-type impurity region in the n-type silicon carbide layer, forming a second p-type impurity region connected to the first p-type impurity region and having a depth shallower than that of the first p-type impurity region and having a p-type impurity concentration higher than that of the first p-type impurity region, forming a gate insulating film extending over surfaces of the n-type silicon carbide layer, the first p-type impurity region, and the n-type impurity region, forming a gate electrode on the gate insulating film, forming a metallic silicide film on the n-type impurity region and the second p-type impurity region, performing ion implantation of phosphorous (P) into the metallic silicide film on the n-type impurity region, and performing a first thermal treatment, performing ion implantation of aluminum (Al) into the metallic silicide film on the second p-type impurity region, and performing a second thermal treatment at a temperature lower than the first thermal treatment.

Further, the metallic silicide film is also formed on the p-type silicon carbide layer, and the phosphorous (Al) is also ion-implanted into the metallic silicide film on the p-type silicon carbide layer before the second thermal treatment.

Figure 14:
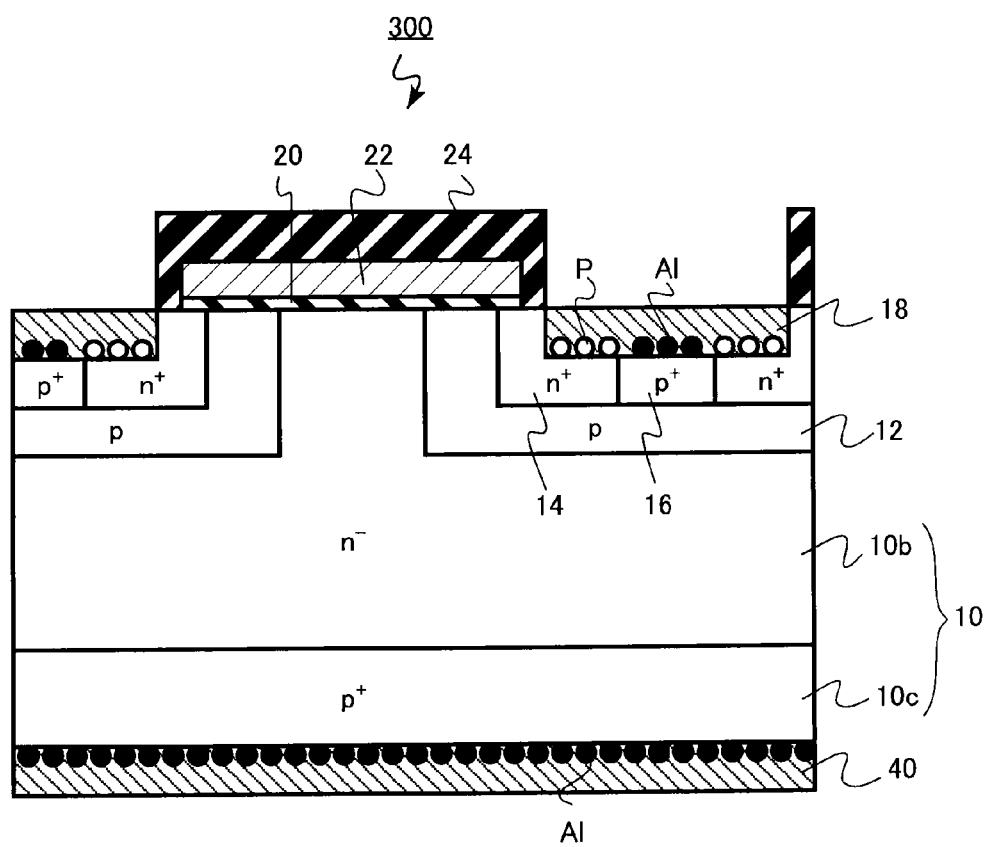
FIG. 14 is a cross sectional schematic diagram illustrating an IGBT manufactured according to the manufacturing method of a third embodiment.

FIG. 14 is a cross sectional schematic diagram illustrating an IGBT manufactured according to the manufacturing method of the present embodiment. As shown in FIG. 14, an IGBT 300 uses a SiC substrate 10 of 4H-SiC including a p$^+$-type SiC layer (p-type silicon carbide layer) 10c and an n$^-$-type SiC layer (n-type silicon carbide layer) 10b.

The p$^+$-type SiC layer 10c includes, for example, Al of which impurity concentration is, e.g., about $5\times10^{18}$ to $1\times10^{19}$ cm$^{-3}$ as a p-type impurity. The p$^+$-type SiC layer 10c functions as a collector region for the IGBT 300.

On the p$^+$-type SiC layer 10c, i.e., the back surface side of the SiC substrate 10, for example, a collector electrode 40 of nickel silicide is formed.

The nickel silicide region 18 functions as an emitter electrode and a well electrode of the IGBT 300.

In the IGBT 300 of the present embodiment, the phosphorous (P) of the n-type impurity is segregated at the interface between the nickel silicide region 18 and the n$^+$-type SiC region 14. Accordingly, the contact resistance between the nickel silicide region 18 and the n$^+$-type impurity region 14 is reduced, and ohmic characteristics are improved.

The aluminum (Al) of the p-type impurity is segregated at the interface between the nickel silicide region 18 and the p$^+$-type impurity region 16 and the interface between the nickel silicide film of the collector electrode 40 and the p$^+$-type SiC layer 10c. Accordingly, the contact resistance between the nickel silicide region 18 and the p$^+$-type impurity region 16 and the contact resistance between the nickel silicide film of the collector electrode 40 and the p$^+$-type SiC layer 10c are reduced, and ohmic characteristics are improved.

Figure 15:
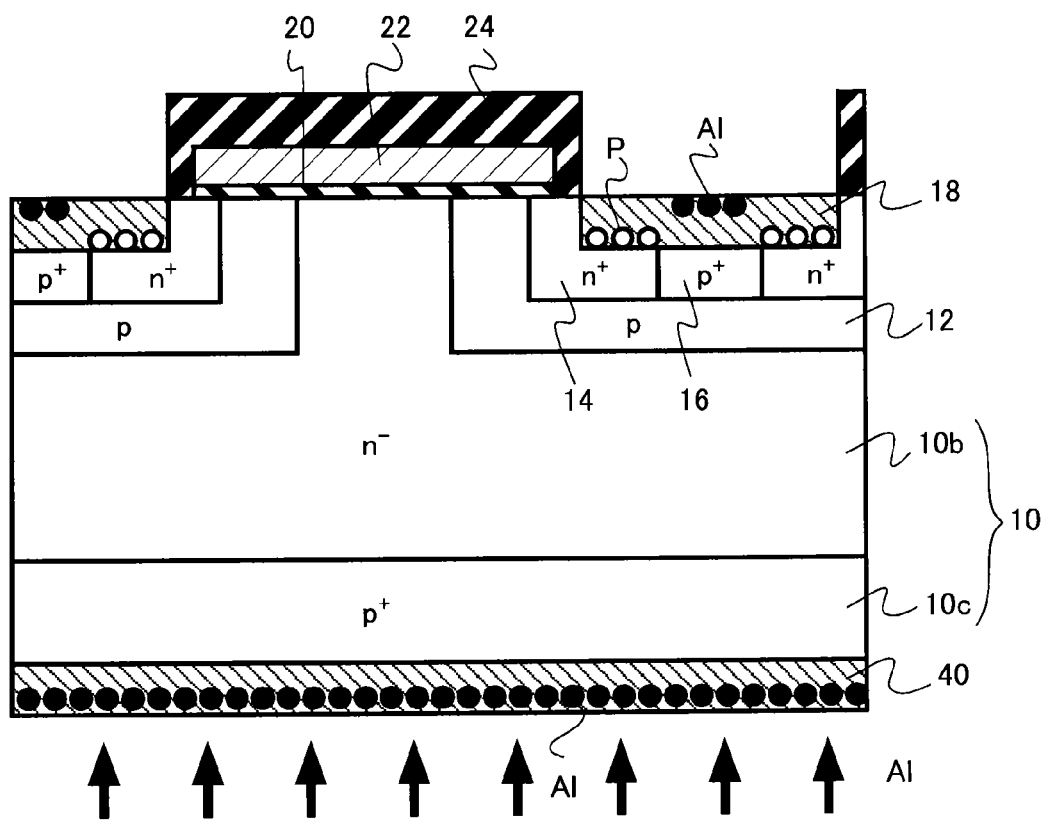
FIG. 15 is a cross sectional schematic diagram illustrating a step of the method for manufacturing the semiconductor device according to the third embodiment.
Figure 16:
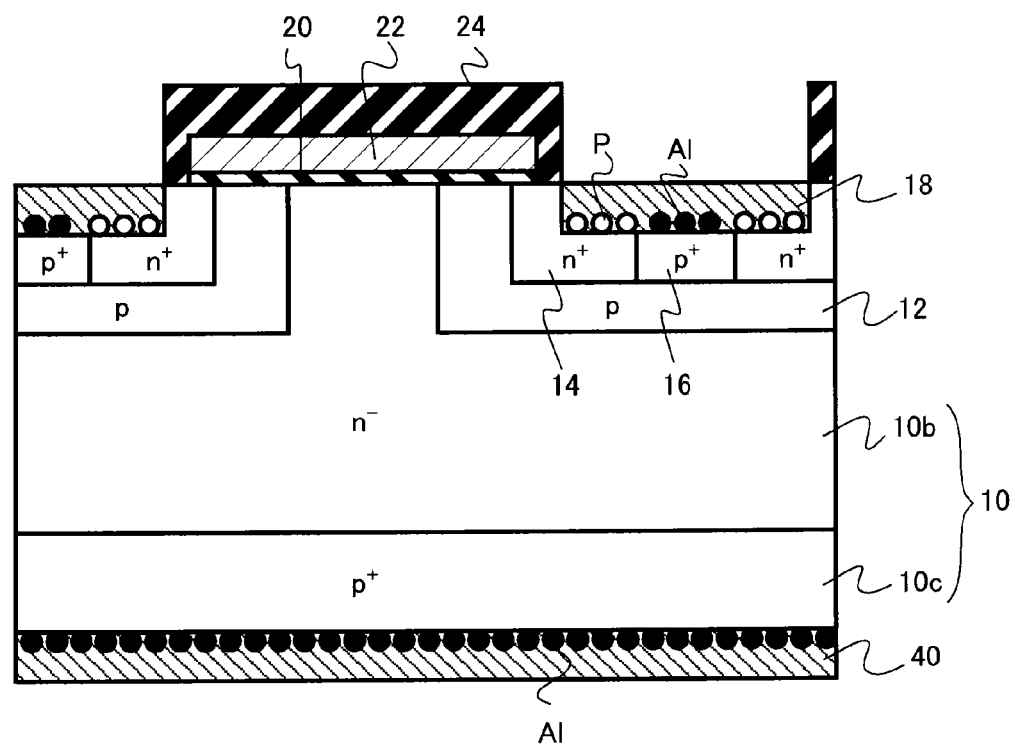
FIG. 16 is a cross sectional schematic diagram illustrating a step of the method for manufacturing the semiconductor device according to the third embodiment.

FIGS. 15 and 16 are cross sectional schematic diagrams illustrating steps of the method for manufacturing the semiconductor device according to the present embodiment. With the P ion implantation into the nickel silicide region 18 on the n$^+$-type SiC region 14 and the first thermal treatment (temperature: $T_1$), the P is segregated at the interface between the nickel silicide region 18 and the n$^+$SiC region 14. Subsequently, after the Al is ion-implanted into the nickel silicide region 18 on the p$^+$-type impurity region 16, the Al is also ion-implanted into the nickel silicide film of the collector electrode 40 of the back surface (FIG. 15).

Subsequently, as the diffusion thermal treatment, the second thermal treatment (temperature: $T_2$) is performed. With this thermal treatment, the Al applied to the nickel silicide region 18 and the nickel silicide film of the collector electrode 40 thermally diffuses in the depth direction of the substrate, and thereby a structure is made such that the Al is segregated at the nickel silicide/SiC interface (FIG. 16).

Preferred conditions of the P, Al ion implantations, the first, second thermal treatments, and the like are the same as those of the first or the second embodiment.

With the above steps, the IGBT 300 of FIG. 14 is formed.

Hereinabove, according to the method for manufacturing the semiconductor device according to the present embodiment, the contact resistance between the emitter electrode, i.e., the n$^+$-type contact electrode, and the well electrode, i.e., the p$^+$-type contact electrode, and the contact resistance of the collector electrode is reduced in the low temperature thermal step, and the ohmic property therebetween is improved. Therefore, the IGBT having excellent characteristics can be manufactured.

Fourth Embodiment

The method for manufacturing a semiconductor device according to the present embodiment is different from the first to third embodiments in that it is a method for manufacturing a PiN diode. Essential portions of the contact formation process of the n$^+$-type contact electrode and the p$^+$-type contact electrode are the same as those of the first to third embodiments. Accordingly, description about the same contents as those of the first to third embodiments is omitted.

Figure 17:
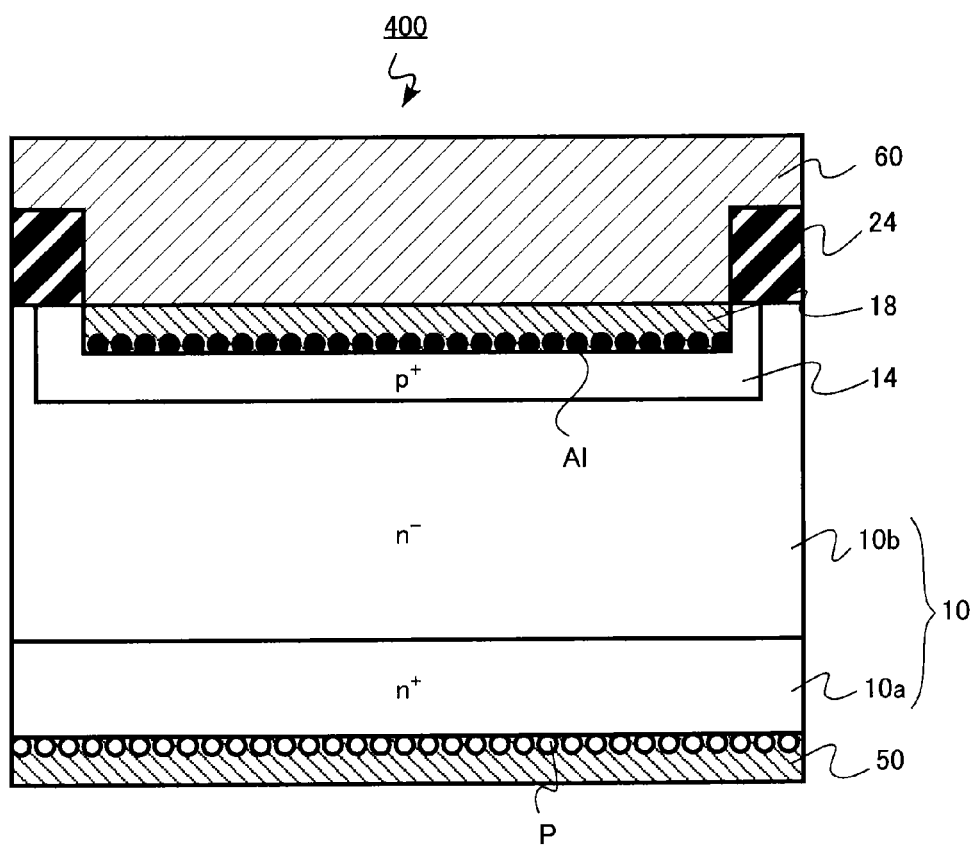
FIG. 17 is a cross sectional schematic diagram illustrating a PiN diode manufactured according to the manufacturing method of a fourth embodiment.

FIG. 17 is a cross sectional schematic diagram illustrating a PiN (p-intrinsic-n) diode manufactured according to the manufacturing method of the present embodiment. As shown in FIG. 17, a PiN diode 400 uses a SiC substrate 10 of 4H-SiC including an n$^+$-type SiC layer 10a and an n$^-$-type SiC layer 10b of which n-type impurity concentration is less than that of the n$^+$-type SiC layer 10a.

The n$^+$-type SiC layer 10a functions as a cathode region of the PiN diode 400. On the n$^+$-type SiC layer 10a, a cathode electrode 50 of a nickel silicide film is provided.

In the n$^-$-type SiC layer 10b, a p$^+$-type SiC region 16 is formed. The p$^+$-type SiC region 16 functions as an anode region of the PiN diode 400. On the p$^+$-type SiC region 16, for example, an anode electrode 60 of aluminum (Al) is formed.

In the PiN diode 400 of the present embodiment, the phosphorous (P) of the n-type impurity is segregated at the interface between the cathode electrode 50 of the nickel silicide film and the n$^+$-type SiC layer 10a. Accordingly, the contact resistance between the cathode electrode 50 and the n$^+$-type SiC layer 10a is reduced, and ohmic characteristics are improved.

The aluminum (Al) of the p-type impurity is segregated at the interface between the nickel silicide region 18 and the p$^+$-type impurity region 16. Accordingly, the contact resistance between the nickel silicide region 18 and the p$^+$-type impurity region 16 is reduced, and ohmic characteristics are improved.

The method for segregating the P and Al at the nickel silicide/SiC interface is the same as the first to third embodiments.

Hereinabove, according to the method for manufacturing the semiconductor device according to the present embodiment, the contact resistance between the cathode electrode, i.e., the n$^+$-type contact electrode, and the anode electrode, i.e., the p$^+$-type contact electrode, is reduced in the low temperature thermal step, and the ohmic property therebetween is improved. Therefore, the PiN diode having excellent characteristics can be manufactured.

Fifth Embodiment

The method for manufacturing a semiconductor device according to the present embodiment is different from the first to third embodiments in that it is the manufacturing method of the MPS (Merged PiN and Schottky) diode. Essential portions of the contact formation process of the n$^+$-type contact electrode and the p$^+$-type contact electrode are the same as those of the first to third embodiments. Accordingly, description about the same contents as those of the first to third embodiments is omitted.

Figure 18:
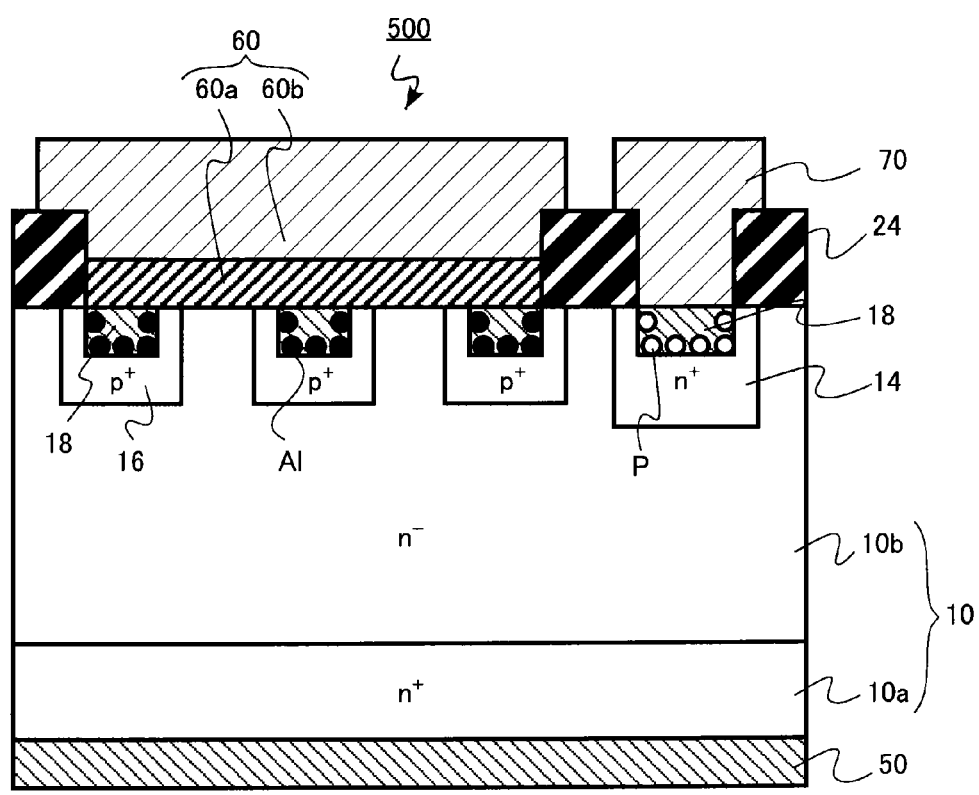
FIG. 18 is a cross sectional schematic diagram illustrating an MPS diode manufactured according to the manufacturing method of a fifth embodiment.

FIG. 18 is a cross sectional schematic diagram illustrating an MPS diode manufactured according to the manufacturing method of the present embodiment. As shown in FIG. 18, an MPS diode 500 uses a SiC substrate 10 of 4H-SiC including an n$^+$-type SiC layer 10a and an n$^-$-type SiC layer 10b of which n-type impurity concentration is less than that of the n$^+$-type SiC layer 10a.

The n$^+$-type SiC layer 10a functions as a cathode region of the MPS diode 500. On the n$^+$-type SiC layer 10a, for example, a cathode electrode 50 of a nickel silicide film is provided.

In the n$^-$-type SiC layer 10b, a p$^+$-type SiC region 16 is formed. The p$^+$-type SiC region 16 functions as a PiN region for passing surge current. On the p$^+$-type SiC region 16, an anode electrode 60 having a stacked structure including a titanium (Ti) layer 60a and an aluminum (Al) layer 60b is formed with the nickel silicide region 18 interposed therebetween. The anode electrode 60 is also formed on the n$^-$-type SiC layer 10b.

The n$^-$-type SiC layer 10b is formed with an n$^+$-type SiC region 14 with an insulating film 24 interposed therebetween and a diode region provided with a p$^+$-type SiC region 16. On the n$^+$-type SiC region 14, a nickel silicide region is formed. The n$^+$-type SiC region 14 functions as a channel stop layer, i.e., a termination structure of the MPS diode 500. On the n$^+$-type SiC region 14, for example, an electrode 70 of aluminum (Al) is formed with the nickel silicide region 18 interposed therebetween.

In the MPS diode 500 according to the present embodiment, the aluminum (Al) of the p-type impurity is segregated at the interface between the nickel silicide region 18 and the p$^+$-type impurity region 16. Accordingly, the contact resistance between the nickel silicide region 18 and the p$^+$-type impurity region 16 is reduced, and ohmic characteristics are improved.

The phosphorous (P) of the n-type impurity is segregated at the interface between the nickel silicide region 18 and the n$^+$-type SiC region 14 of the channel stop layer. Accordingly, the contact resistance between the electrode 70 and the n$^+$-type SiC region 14 is reduced.

The method for segregating the P and Al at the nickel silicide/SiC interface is the same as the first to third embodiments.

It should be noted that the junction between the n$^-$-type SiC layer 10b and the titanium (Ti) layer 60a is Schottky junction.

In the MPS diode, the insulating film 24 such as oxide film is formed on the SiC in the junction termination region. When the interface between the oxide film and the SiC is made rough due to the high-temperature annealing for forming the contact electrode, the extension of the depletion layer is affected, which may cause problems such as drop of the withstand voltage, increase of the leakage current, and reduction of the reliability. According to the present embodiment, the electrode with high ohmic property can be formed at a low temperature thermal step, and this is effective.

Hereinabove, according to the method for manufacturing the semiconductor device according to the present embodiment, the contact resistance between the electrode having the termination structure, i.e., the n$^+$-type contact electrode, and the anode electrode having the p$^+$-type contact electrode is reduced in the low temperature thermal step, and the ohmic property therebetween is improved. Therefore, the MPS diode having excellent characteristics can be manufactured.

A termination structure for alleviating electric field such as resurf structure may be applied as necessary to the SiC surface of the SiC region device end portion in contact with the region formed with the insulating film 24 in FIG. 18 in accordance with the purpose of the device.

While certain embodiments have been described, these embodiments have been presented by way of example only, and are not intended to limit the scope of the inventions. Indeed, a method for manufacturing a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, in the explanation about the embodiments, the nickel silicide is used as the metallic silicide of the electrode, but the metal reacted with the SiC for forming the metallic silicide film is not limited to the nickel (Ni). A metal for forming silicide with solid phase reaction with SiC upon thermal treatment may be used as necessary according to the form of a device. For example, a stacked structure or an alloy of metal preferentially reacting with C in reaction with SiC such as Ni/Ti and Ni—Ti alloys may be used.

The reaction between SiC and metal is performed at a temperature higher than the reaction temperature between silicon (Si) and metal, and this may deteriorate the device characteristics of the manufactured device. In this case, the reaction temperature may be reduced by including, e.g., Si and Ge in the above metal. The composition ratio between the metal and Si may be adjusted by controlling the temperature, the time, and the like of thermal treatment according to a work function of the electrodes required in the device. Examples of used metals include not only Ni but also Pd, Pt, Co, Ta, Hf, Zr, and Ti.

What is claimed is:

1. A method for manufacturing a semiconductor device, comprising:
    forming a metallic silicide film on an n-type impurity region and a p-type impurity region made of silicon carbide (SiC);
    performing ion implantation of phosphorous (P) into the metallic silicide film on the n-type impurity region;
    performing a first thermal treatment;
    performing ion implantation of aluminum (Al) into the metallic silicide film on the p-type impurity region; and
    performing a second thermal treatment at a temperature lower than the first thermal treatment.

2. The method according to claim 1, wherein the temperature of the first thermal treatment is 550° C. to 700° C., and the temperature of the second thermal treatment is 500° C. to 600° C.

3. The method according to claim 1, wherein the metallic silicide film is formed by reaction of a metallic film formed on the n-type impurity region and the p-type impurity region and a silicon carbide in the n-type impurity region and the p-type impurity region, and
    the silicon carbide in the n-type impurity region and the p-type impurity region is made into amorphous state by ion implantation with germanium (Ge), silicon (Si), or a rare gas element before the metallic film is formed.

4. The method according to claim 1, wherein the metallic silicide film is a nickel silicide film.

5. A method for manufacturing a semiconductor device, comprising:

preparing a semiconductor substrate having a first n-type silicon carbide layer and a second n-type silicon carbide layer of which n-type impurity concentration is less than that of the first n-type silicon carbide layer;

forming a first p-type impurity region in the second n-type silicon carbide layer;

forming an n-type impurity region in the second n-type silicon carbide layer;

forming a second p-type impurity region connected to the first p-type impurity region and having a depth shallower than that of the first p-type impurity region and having a p-type impurity concentration higher than that of the first p-type impurity region;

forming a gate insulating film extending over surfaces of the second n-type silicon carbide layer, the first p-type impurity region, and the n-type impurity region;

forming a gate electrode on the gate insulating film;

forming a metallic silicide film on the n-type impurity region and the second p-type impurity region;

performing ion implantation of phosphorous (P) into the metallic silicide film on the n-type impurity region; and performing a first thermal treatment;

performing ion implantation of aluminum (Al) into the metallic silicide film on the second p-type impurity region, and performing a second thermal treatment at a temperature lower than the first thermal treatment.

* * * * *